(12) United States Patent
Teragaki et al.

(10) Patent No.: US 12,745,581 B2
(45) Date of Patent: Sep. 22, 2026

(54) WAFER DICING METHOD AND LIQUID EJECTION HEAD

(71) Applicant: CANON KABUSHIKI KAISHA, Tokyo (JP)

(72) Inventors: Takashi Teragaki, Kanagawa (JP); Tetsuro Yasukawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 311 days.

(21) Appl. No.: 18/495,631

(22) Filed: Oct. 26, 2023

(65) Prior Publication Data

US 2024/0145310 A1 May 2, 2024

(30) Foreign Application Priority Data

Oct. 31, 2022 (JP) ................................ 2022-174572

(51) Int. Cl.
*H10P 54/00* (2026.01)
*B41J 2/16* (2006.01)

(52) U.S. Cl.
CPC ................ *H10P 54/00* (2026.01); *B41J 2/16* (2013.01); *B41J 2/162* (2013.01); *B41J 2/1635* (2013.01)

(58) Field of Classification Search
CPC .... H10P 54/00; B41J 2/16; B41J 2/162; B41J 2/1635
See application file for complete search history.

(56) References Cited

U.S. PATENT DOCUMENTS 6,992,026 B2 * 1/2006 Fukuyo .................. H10P 54/00 700/121
2016/0377513 A1 12/2016 Chang et al.
2017/0212097 A1 7/2017 Katsumoto et al.
2017/0361616 A1 * 12/2017 Takahashi ............. B41J 2/1603
2020/0240933 A1 7/2020 Yuk et al.

FOREIGN PATENT DOCUMENTS

JP 2021-177537 A 11/2021

* cited by examiner

*Primary Examiner* — Timor Karimy
(74) *Attorney, Agent, or Firm* — Canon U.S.A., Inc., IP Division

(57) ABSTRACT

One embodiment of the present disclosure is a stealth dicing method performed on a wafer having a first substrate, a second substrate, and a hollow portion, the second substrate being thinner than the first substrate in a region defining the hollow portion. The stealth dicing method has a first step of performing laser application on the second substrate to form a modified region in the second substrate and a second step of performing laser application on the first substrate after the first step to form a modified region in the first substrate. In either the first or second step, multiple modified regions are formed, arranged in the Z-direction at positions corresponding to both sides of the hollow portion in the Y-direction, and in the other step, multiple modified regions are formed, arranged in the Z-direction at a position corresponding to one side of the hollow portion in the Y-direction.

13 Claims, 13 Drawing Sheets

10
22
23
24
21
25
20
Z
Y 40
40
22
23
40
10
24
21
25
20
Z
Y 40
10
24
21
25
20
Z
X 40
10
20
25
21
24
Z
Y
23
22

40
10
20
25
21
24
Z
X

WAFER DICING METHOD AND LIQUID EJECTION HEAD

BACKGROUND

Field

The present disclosure relates to a wafer dicing method and a liquid ejection head.

Description of the Related Art

Stealth dicing, which uses a laser, is one of wafer dicing methods. In stealth dicing, a laser beam is focused along predetermined dicing lines to form modified regions as regions with low strength. Then, a dicing tape is expanded in order for dicing to occur at the modified regions thus formed, thereby singulating chips from the wafer.

Japanese Patent Laid-Open No. 2021-177537 (Patent Literature 1) overcomes a problem with a multi-layer wafer of different materials, i.e., a wafer made up of a plurality of substrates, by application of lasers from each surface according to the wavelengths of the materials.

However, the technique in Patent Literature 1 does not consider that at an interface between materials, a laser beam refracts in a direction different from a predetermined direction. For this reason, in a case where stealth dicing is performed on a wafer with hollow portions, Patent Literature 1 fails to address processing failures such as wafer cracking or improper dicing.

SUMMARY

The present disclosure provides improvements to the dimensional accuracy of singulated chips and reduces the possibility of processing failures occurring in stealth dicing of a wafer with hollow portions.

An embodiment of the present disclosure is a stealth dicing method performed on a wafer having a first substrate, a second substrate bonded to the first substrate, and a hollow portion defined by a concave portion at least partially disposed adjacent to an interface of the first substrate and the second substrate, the second substrate being thinner than the first substrate in a region including the hollow portion, the stealth dicing method including: a first step of performing laser application on the second substrate to form a modified region in the second substrate, the modified region being a region for dicing and having low crystal strength; and a second step of performing laser application on the first substrate to form a modified region in the first substrate, in which with an X-direction being a direction in which the hollow portion extends, a Z-direction being a direction of a thickness of the wafer, and a Y-direction being a direction orthogonal to the X-direction and the Z-direction, in one of the first step and the second step, a plurality of the modified regions are formed, arranged in the Z-direction at positions corresponding to both sides of the hollow portion in the Y-direction, and in another one of the first step and the second step, a plurality of the modified regions are formed, arranged in the Z-direction at a position corresponding to one side of the hollow portion in the Y-direction.

Further features of the present disclosure will become apparent from the following description of embodiments with reference to the attached drawings.

DESCRIPTION OF THE EMBODIMENTS

Embodiments of the present disclosure are described below with reference to the drawings. Note that the description below is not intended to limit the scope of claims more than necessary. Also, although the wafer in the description below has a double-layer structure with terminals arranged on an inner surface of a hollow portion, this structure is merely an example. The method according to the present disclosure can be applied to wafers with three or more layers or wafers with no terminals. Further, as a chip, although a chip for inkjet printing is used in the description below, what is described in the present disclosure can also be applied to chips that are not for inkjet printing.

Problem to be Addressed by the Present Disclosure

A supplementary explanation is provided below for the problem described earlier. Patent Literature 1 does not consider that in a multilayer substrate wafer formed of a plurality of substrates, a laser beam refracts at an interface between materials in a direction different from a predetermined direction because the stack is formed of pre-stack substrates of different materials with different indices of refraction. For this reason, a laser beam cannot be focused at a predetermined region, and consequently, a modified region cannot be formed. Thus, the wafer cannot be divided by external application of force, which makes dicing difficult.

A conceivable countermeasure against this problem is to provide lasers suitable for the respective materials of the substrates as lasers for the respective substrates and go through a process of forming modified regions for each substrate surface to which a laser is applied, from each surface (i.e., the front surface and the back surface) of the wafer. This makes predetermined dicing possible and facilitates processing. However, in order to focus a laser beam onto a predetermined location, the laser beam needs to transmit through layers with different indices of refraction. Thus, there would be difficulty in processing of a wafer with three or more layers.

Incidentally, it is possible to create a space between a plurality of substrates forming a wafer by bonding the substrates together. This space is defined herein as a "hollow portion" between substrates of a wafer. In a case where a laser is applied only from one of the surfaces of a wafer with hollow portions, a laser applied by an irradiation apparatus is applied from a wide region on the same plane and focused onto a single point. Thus, it is difficult for the laser beam to be focused at a desired depth in a case where the laser beam passes through layers with different indices of refraction. Thus, in stealth dicing of a wafer with hollow portions, it is a common practice to process the wafer from both surfaces because it is difficult to process the wafer from only one surface.

Figure 1:
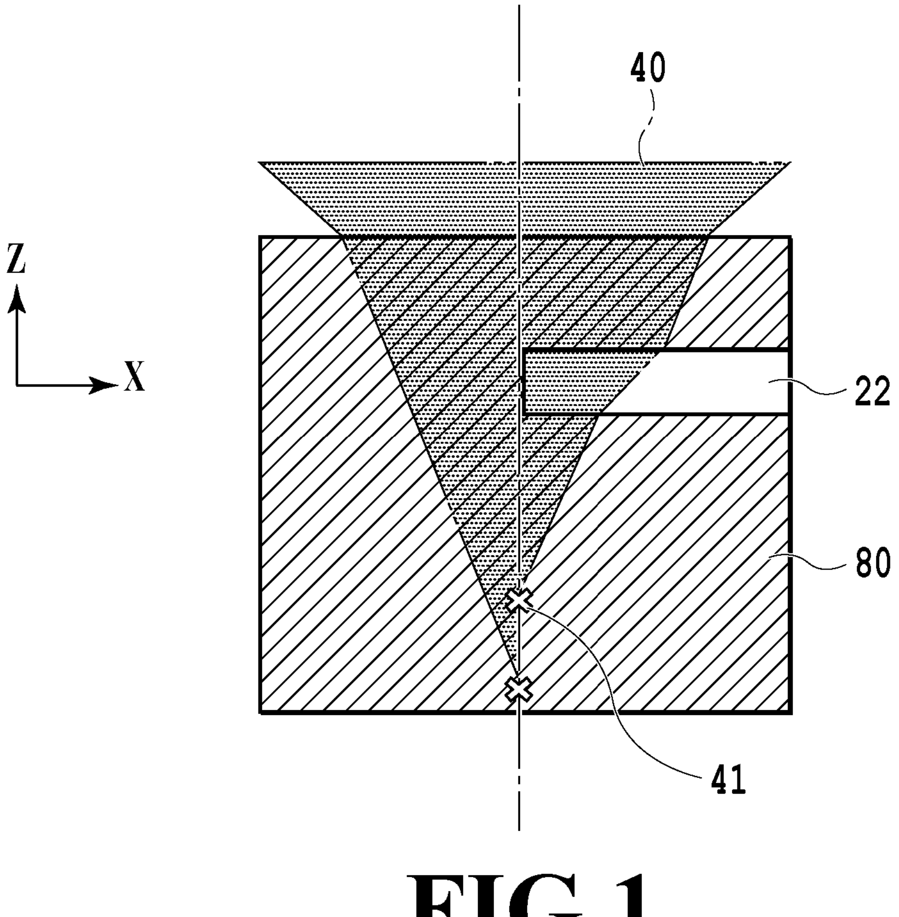
FIG. 1 is a schematic diagram of a wafer with hollow portions to which the technical concept of the present disclosure can be applied.

As shown in FIG. 1, in a case where a laser 40 travels in a Z-axis direction and at a certain position in the Z-axis direction, a half of an X-direction region irradiated with the laser 40 is occupied by the region of a hollow portion 22, the laser 40 takes different optical paths in the left part and the right part across a center axis because refraction acts differently in a substrate portion and the hollow portion. This hinders laser focusing. More specifically, laser focusing is hindered by the fact that the refractive index of the substrate portion is greater than 1, whereas the refractive index of the hollow portion, which is air, is substantially 1. This is why it is necessary to perform processing such that lasers enter through both surfaces of substrates.

Figure 2:
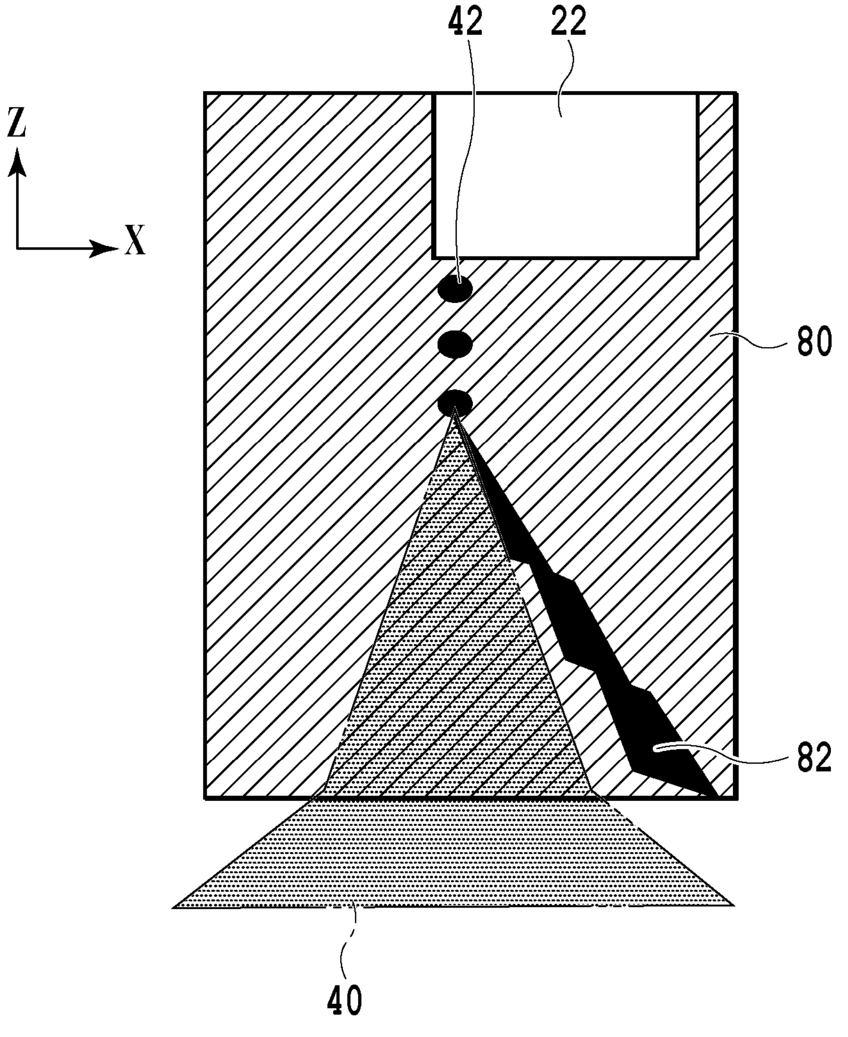
FIG. 2 is a schematic diagram showing occurrence of cracking, which is a problem to be tackled by the present disclosure.
Figure 5A:
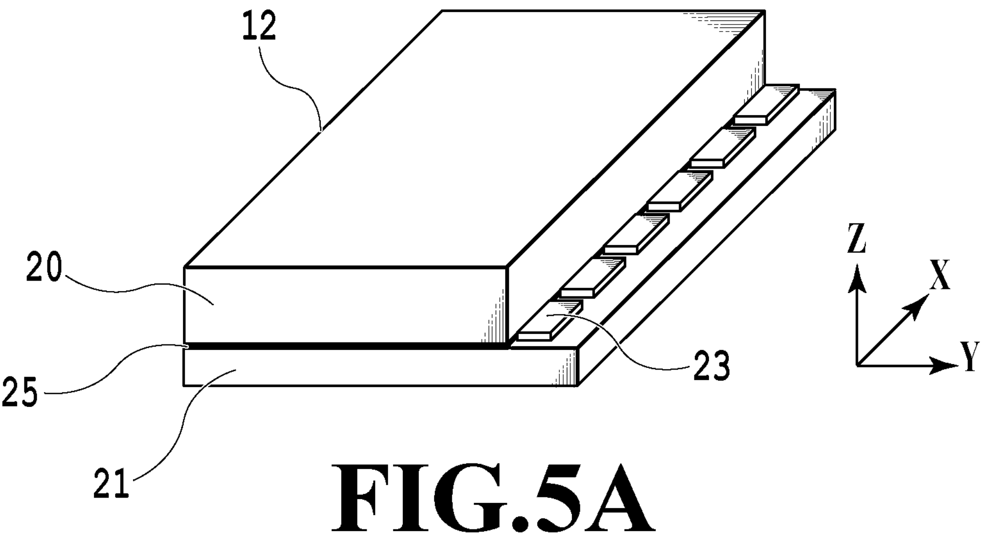
FIGS. 5A and 5B are perspective views showing the structure of a chip obtained by wafer dicing.

Also, in processing performed to obtain an L-shaped structure in which a hollow portion is exposed at one side of a chip as shown in FIG. 5A, it is necessary to provide a total of three dicing lines: one dicing line from a first surface of a wafer and two dicing lines from a second surface opposite from the first surface. Note that a case of providing three dicing lines will be described later using, e.g., FIGS. 8A and 8B. In this case, providing dicing lines randomly (i.e., for example, without considering the order of providing the dicing lines), may cause strain and stress to concentrate at one part, and the wafer may crack because of not being able to withstand the tension constantly applied by a dicing tape. FIG. 2 shows an example where a crack 82 is produced in the middle of forming a plurality of modified regions 42 in a silicon substrate 80.

Stealth dicing is a method that reduces the strength of a substrate against dicing along a dicing line by forming modified regions through laser application. Because a substrate with hollow portions is thinner than one without hollow portions, such a substrate is even weaker against dicing. Thus, in a process of forming modified regions, it is important that the modified regions be formed while maintaining proper strength necessary to achieve precise dicing.

The following is an example of the mechanism of how the above-described cracking occurs: as the modified region forming process progresses, the strength of the entire substrate lowers, and the strength may fall below the proper strength against dicing. Once the strength of the substrate falls below the sectional stress generated by the tension of the dicing tape, unintended dicing of the wafer occurs. Examples of conditions under which unintended dicing tend to occur include: stress concentrates at a particular location on a thin substrate, a laser output is too intense for the thickness, or too many modified regions are formed. Patent Literature 1 cannot address the processing failures such as dicing failure described above.

<Wafer Structure>

Figure 3:
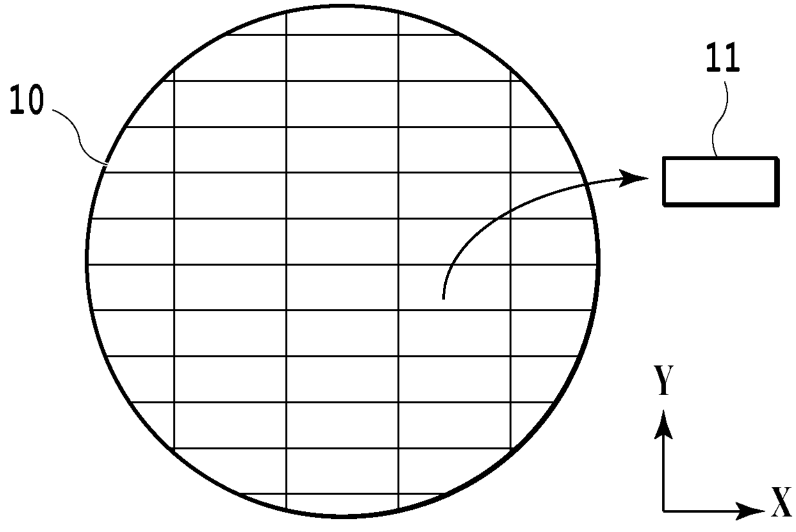
FIG. 3 is a schematic diagram of a wafer to which the technical concept of the present disclosure can be applied.
Figure 4:
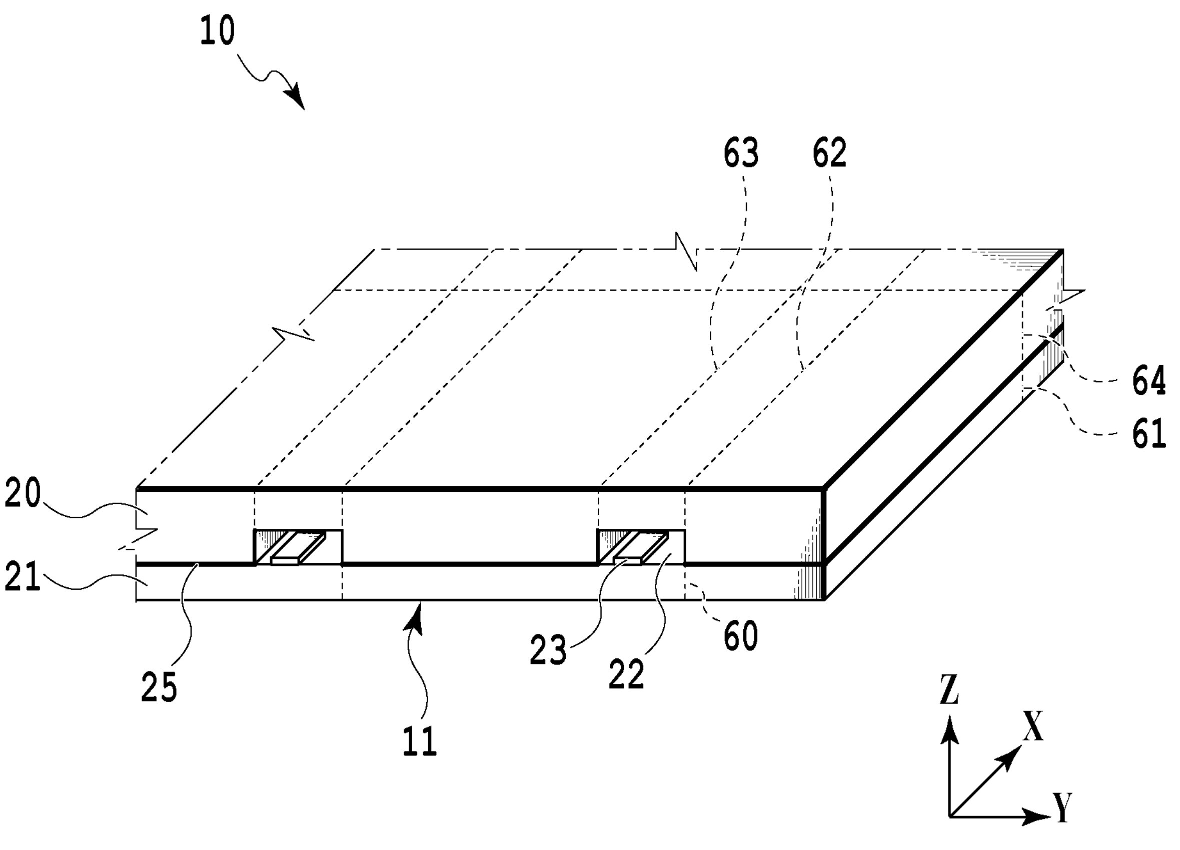
FIG. 4 is a schematic diagram of the structure of a wafer formed of a plurality of layers to which the technical concept of the present disclosure can be applied.

FIG. 3 is a schematic diagram of a circular-plate wafer 10 to which the present disclosure can be applied. FIG. 4 is a schematic diagram showing the structure of a chip 11 obtained by singulating chips from the wafer 10.

Figure 5B:
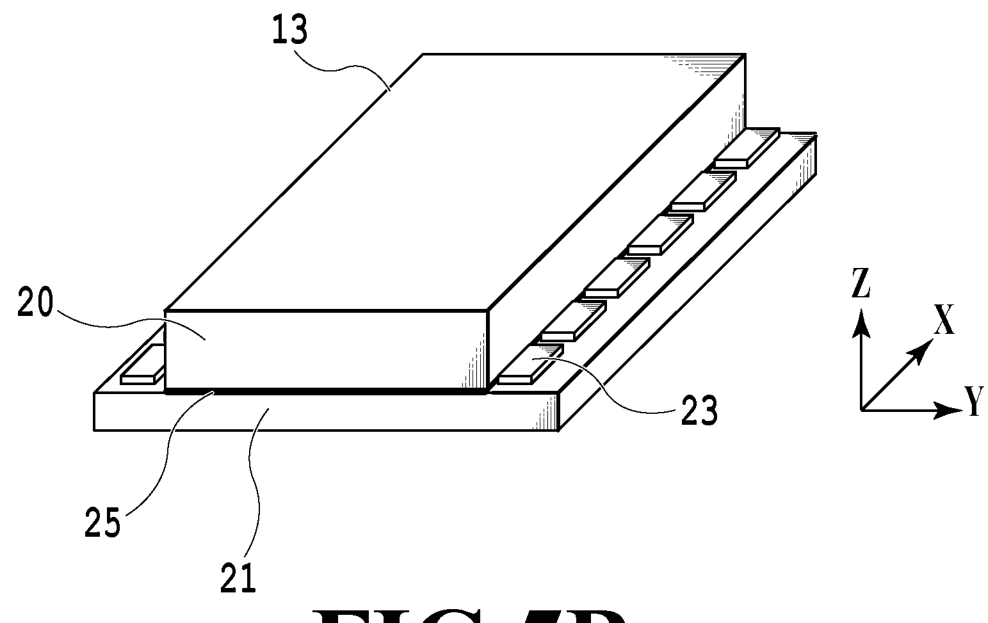

FIGS. 5A and 5B are schematic diagrams of examples of a chip obtained by singulation. More specifically, FIG. 5A shows a chip 12 with terminals at one side (L-shaped) which is obtained with the positions of laser application for a hollow portion being the same for every chip, and FIG. 5B shows a chip 13 with terminal at both sides (inverted T-shaped) which is obtained with the positions of laser application for a hollow portion being line-symmetric for every chip.

Note that in FIGS. 3 to 5B, an X-direction is a direction in which the hollow portion 22 extends and in which a plurality of terminals 23 are arranged, a Z-direction is a direction of the thickness of the wafer 10 (chip) which is a stack wafer, and a Y-direction is a direction orthogonal to the X-direction and the Z-direction. The above coordinate axes are set and used in FIG. 3 and onwards.

The wafer 10 used in the embodiments of the present disclosure has two or more substrates facing each other and bonded together. As examples of the substrates forming the wafer 10, there are a first substrate with concave portions or hollowed-out portions and a second substrate without concave portions or hollowed-out portions, and the first and second substrates are bonded together. By creating spaces between the first substrate and the second substrate bonded together, the wafer 10 has the hollow portions 22 (see, e.g., FIG. 4). Also, as shown in the drawings, the first substrate with concave or hollowed-out portions are thicker (longer in the Z-direction) than the second substrate.

The following describes a stealth dicing method for singulating chips from the wafer 10, which is a bonded wafer, by applying a laser toward the above-described hollow portions 22 from both surfaces of the wafer 10 and exposing the hollow portions 22.

First, stealth dicing is described. In stealth dicing, a laser beam is focused using an objective optical system and applied to the wafer 10 along predetermined dicing lines, thereby forming modified regions in a material layer on the dicing lines, the modified regions being regions with low crystal strength. Then, an external force is applied through an expansion step or the like to dice the wafer 10 with the dicing originating from the modified regions formed. What is meant by low crystal strength herein is that the crystal strength is low relative to a surrounding region where no focused laser beam is applied.

A process of the above formation of modified regions is described. A "modified region," which is a region with reduced crystal strength, is formed by a laser applied so that a laser beam may be focused at a predetermined depth from a wafer surface. The wafer 10 of the present embodiment can move in a direction perpendicular to the laser beam application axis (the Z-direction axis), i.e., can move on the X-Y plane. The wafer 10 can also rotate. In other words, the wafer 10 can move and rotate about the Z-axis by $\theta$.

By performing laser application and scanning with a predetermined period on a wafer moving at a predetermined speed relative to the irradiation apparatus, a layer with modified regions can be formed along scan lines at a predetermined depth from a wafer surface. Note that a layers of modified regions can be formed at a plurality of positions in the Z-direction perpendicular to the wafer surface by focusing a laser beam at each of different predetermined depths using different laser focal lengths and performing laser application and scanning at each of those depths.

The more modified region layers there are, the larger the number of times the application and scanning needs to be performed, but the precision and the dicing performance in the expansion can be improved. The number of modified region layers and the laser intensities can be adjusted appropriately to suit various factors such as the thickness of an object to be cut. Applying an external force for division after modified regions are formed along predetermined dicing lines makes it possible for the wafer to be diced along the dicing lines, the dicing originating from the locations where the force is applied. Also, because stealth dicing is performed without touching the wafer, stealth dicing is a method that allows reduction in contamination or damage on the wafer due to cutting powder and cutting water, compared to blade dicing, which is another known dicing approach.

First Embodiment

Figure 6:
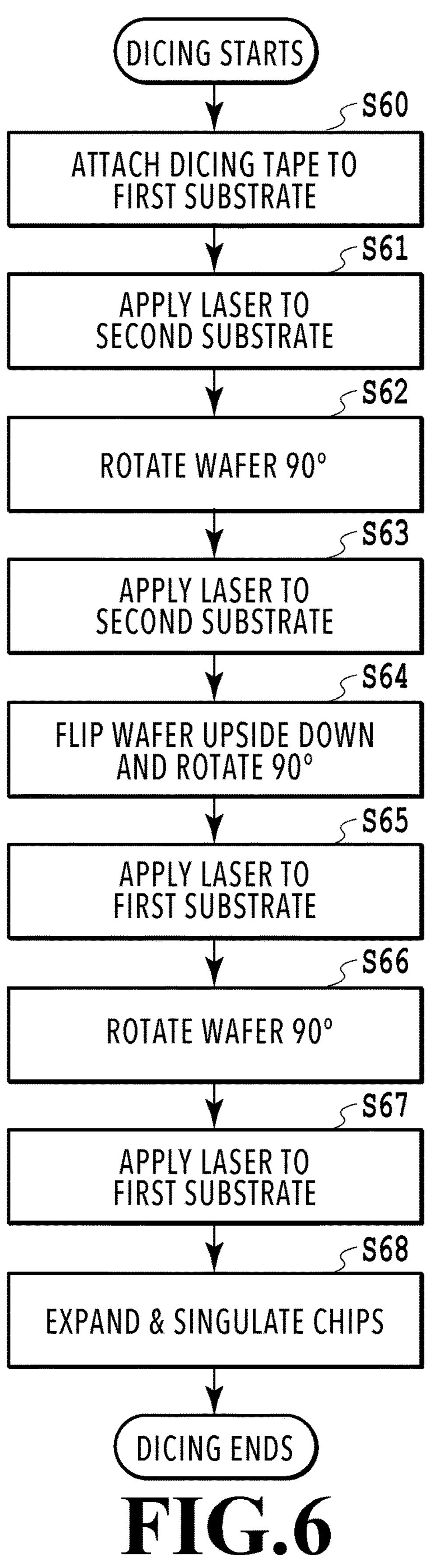
FIG. 6 is a flowchart of a dicing method of a first embodiment.

A first embodiment according to the present disclosure is described below using FIGS. 6 to 9. FIG. 6 is a flowchart of a dicing method of the present embodiment. This dicing method has Steps S60 to S68. FIGS. 7A to 7E are schematic diagrams showing a process of stealth dicing of the wafer 10 according to the present embodiment.

Figure 8A:
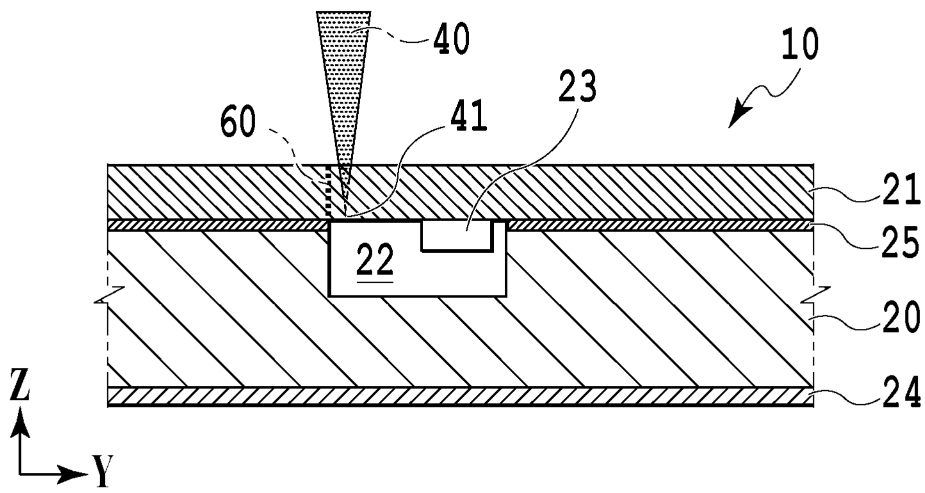
FIGS. 8A and 8B are schematic diagrams showing the dicing method of the first embodiment.

FIG. 8A is a sectional view of the wafer 10 of the present embodiment. As shown in FIG. 8A, the wafer 10 is formed by a first substrate 20 and a second substrate 21 bonded together to have the hollow portions 22 therebetween. In the hollow portions 22 created by the concave portions in the first substrate 20, terminals 23 for electric connection are provided on a surface of the second substrate 21.

Also, because the first substrate 20 and the second substrate 21 are bonded with an adhesive, there is an adhesive layer 25 between the first substrate 20 and the second substrate 21. The thickness of the first substrate 20 (the length in the Z-direction) is such that, as described earlier, the thickness of regions without the concave portions for the hollow portions 22 is larger than the thickness of the second substrate 21 (i.e., the length between the interface of the second substrate 21 and the hollow portion 22). The thickness regions with the concave portions for the hollow portions 22 may be substantially the same as, larger than, or smaller than the thickness of the second substrate 21.

To expose the terminals 23, dicing lines need to be formed by application of two lasers 40 to the first substrate 20 and one laser 40 to the second substrate 21. In this process, part of the first substrate 20 becomes waste, and for this reason, a dicing tape 24 for waste collection is attached to the surface from which the waste is going to be produced.

Step S60 in FIG. 6 is a step for attaching the dicing tape 24 to the first substrate 20 of the wafer 10. The dicing tape 24 is first attached and secured to a typical dicing frame (not shown) larger than the outer circumference of the wafer 10, and the dicing tape 24 thus secured is attached to the wafer 10. Note that it is desirable that a tape employed as the dicing tape 24 be a tape through which the lasers 40 used in the stealth dicing method to be described later easily transmit.

Figures 7A, 7B, 7C, 7D, 7E:
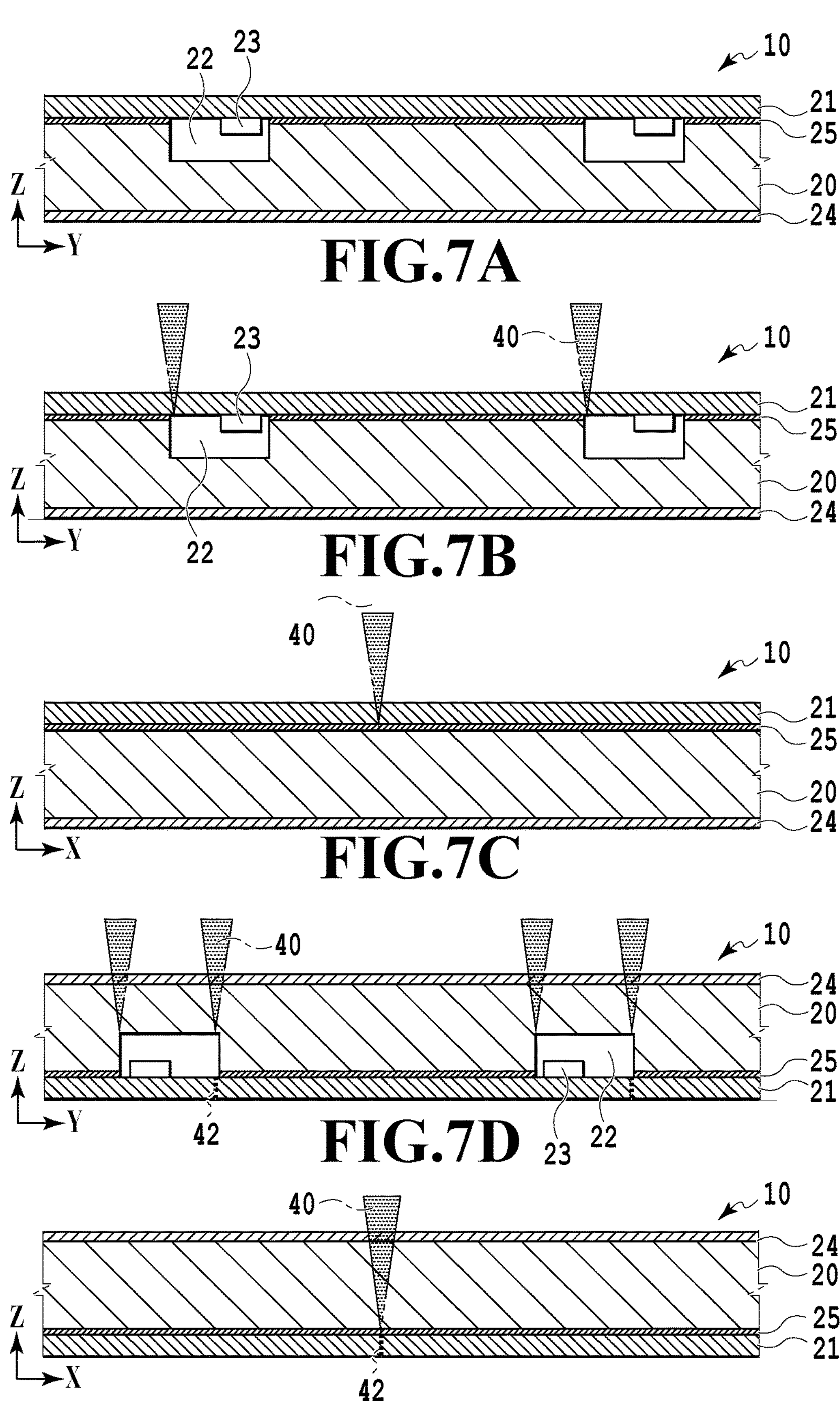
FIGS. 7A to 7E are schematic diagrams showing a process of stealth dicing of the first embodiment.

In S61, laser application and scanning are performed on the second substrate 21 above the hollow portions 22 along dicing lines 60. In this step, as shown in FIG. 7B, the laser application is performed from the surface on the second substrate 21 side where the dicing tape 24 is not attached. The reason for this is because in the present example, the length from the surface on the second substrate 21 side to the hollow portions 22 is shorter than the length from the surface on the first substrate 20 side where the dicing tape 24 is attached to the hollow portions 22.

Note that in a mode different from the present example (FIGS. 7A to 7E), i.e., in a mode where the length from the surface on the first substrate 20 side to the hollow portions 22 is shorter than the length from the surface on the second substrate 21 to the hollow portions 22, the laser application is performed first from the surface on the first substrate 20. In other words, the first substrate 20 is processed prior to the processing of the second substrate 21.

The substrate with the relatively short length between the outer surface and the hollow portions 22, i.e., the substrate which is relatively thin in regions with the hollow portions 22, has a smaller sectional area in the regions with the hollow portions 22 than the relatively thick substrate. Also, the relatively thin substrate has smaller threshold strength against dicing in the X-axis direction (or the Y-axis direction) perpendicular to the wafer surface than the relatively thick substrate. Moreover, by the time of laser application in S65 to be described later, not only has the threshold strength against dicing in the X-axis or Y-axis direction decreased as more modified regions were formed, but also stress has concentrated at the remaining regions where modification is going to take place. Also, the change in threshold strength due to an increase in the modified regions is large, or specifically, the threshold strength drastically decreases.

Due to various factors described above, the wafer 10 may become unable to withstand the tension constantly exerted by the dicing tape 24. Thus, attaching the dicing tape 24 not to the surface on the relatively thin substrate side is effective in preventing occurrence of unintended cracking. It is also effective to process the relatively thin substrate prior to processing of the relatively thick substrate, or in other words, not to perform the processing of the relatively thin substrate as a step immediately before expansion.

Using a stealth dicing approach, the depth of laser beam application of the laser 40 is adjusted between the outer surface (the interface) on the second substrate 21 side and the surface at the border with the hollow portions 22 (the lower surface of the second substrate 21 in FIG. 7B), and laser scanning is performed at the laser beam application depth thus adjusted. As a result, a plurality of modified regions 42 are formed along each predetermined dicing line 60 (specifically in the X-direction (see, e.g., FIG. 4)) at positions different from one another in the Z-direction. In this event, the modified regions are formed from the ones deeper from the surface from which the laser is applied.

Figure 8B:
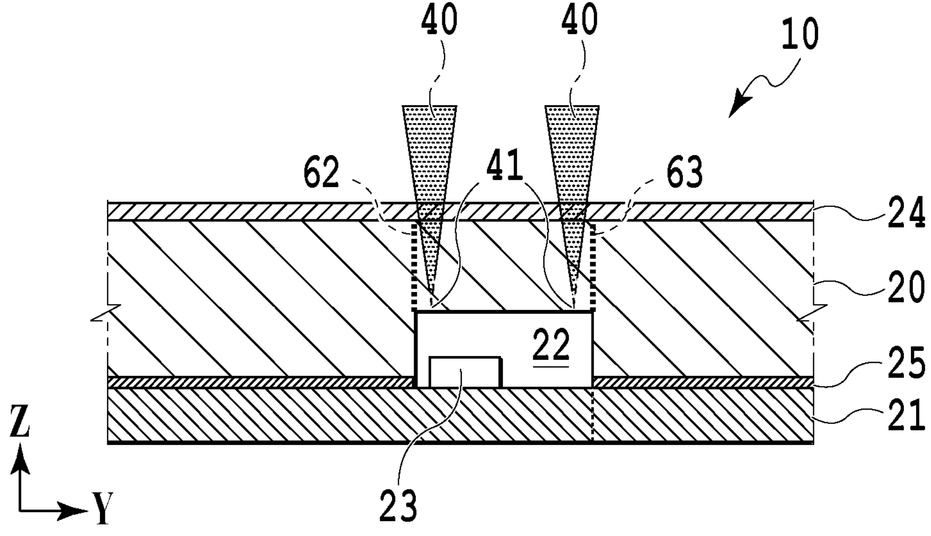

A description is given of how the laser 40 is applied in order to form modified regions from the ones at deeper positions. Typically, in a case where the laser 40 is applied in the order from the shallowest position to the deepest position, the modified region 42 formed at a shallow position makes it difficult for the laser 40 to reach a deeper position. This is the reason why laser application needs to be done from the position closer to the hollow portion 22, i.e., a deeper position. Using FIGS. 8A and 8B, a description is given of laser application positions in the stealth dicing approach in the present embodiment. FIGS. 8A and 8B are schematic diagrams showing a hollow-portion dicing method of the present embodiment. More specifically, FIG. 8A shows the relation between the position of a dicing line at the surface on the second substrate side and the position of laser application, and FIG. 8B shows the relation between the dicing lines at the surface on the first substrate side and laser application positions.

In FIG. 8A, the laser 40 enters through the outer surface on the second substrate 21 side, and as for a position in the Y-direction, the laser is applied from a location slightly offset from the dicing line 60 toward the center of the hollow portion 22 so as to reach the inside of a border plane defining the hollow portion 22 which is on the XY-plane. Note that in a case where the laser is not applied so as to reach the inside of a border plane defining the hollow portion 22 which is on the XY-plane, problems occur later, such as the second substrate 21 failing to be diced or predetermined dicing line shapes failing to be obtained. For this reason, the laser 40 is applied considering the apparatus's tolerance so as to ensure that a laser focus portion 41 falls within the border plane defining the hollow portion 22, which is on the XY-plane, near the predetermined dicing line. To this end, the application position is adjusted so as to stay within the allowable tolerance of the chip and the apparatus.

Back to the description with FIG. 6, in S62, the wafer 10 is rotated 90° about the Z-axis.

In S63, laser application and scanning is performed on the second substrate 21 above the hollow portions 22 along dicing lines 61. Specifically, as shown in FIG. 7C, using a stealth dicing approach, the depth of laser beam application of the laser 40 is adjusted between the outer surface (the interface) on the second substrate 21 side and the adhesive layer 25, and laser scanning is performed at the laser beam application depth thus adjusted. As a result, a plurality of modified regions 42 are formed along each predetermined dicing line 61 (specifically in the Y-direction (see, e.g., FIG. 4)) at positions different from one another in the Z-direction. In this event, the modified regions are formed from the ones at positions farther away from (i.e., deeper relative to) the outer surface (the interface) from which the laser is applied.

In S64, the wafer 10 is flipped upside down and is rotated 90°. As a result of this step, the surface on the first substrate 20 side is now the surface on which laser application can be performed (see FIG. 7D).

In S65, along dicing lines 62 and dicing lines 63, laser application and scanning is performed on the first substrate 20, which has the hollow portions 22 and which is thicker than the second substrate 21 (see FIGS. 4 and 7D). In this step, in order for the wafer to be diced after the stealth dicing, modified regions 42 are formed in the first substrate 20 through the dicing tape 24.

In S65, first, modified regions are formed along the dicing lines 62. Specifically, the depth of laser beam application of the laser 40 is adjusted between the XY-plane of the first substrate 20 defining the hollow portions 22 and the surface of the first substrate 20 to which the dicing tape 24 is attached. Then, laser scanning is performed along each dicing line 62 at the adjusted laser beam application depth. Such laser scanning is performed a plurality of times at different laser beam application depths. As a result, a plurality of modified regions 42 are formed along each predetermined dicing line 62 (in the X-axis direction) at positions different from one another in the Z-direction.

Application and scanning of the laser 40 along the dicing lines 62, which is performed after the dicing lines 60 and before the dicing lines 63, is described to describe control related to application and scanning of the laser 40 in S65. In the formation of the modified regions corresponding to the dicing lines 62, stress tends to concentrate at the remaining part at the time of modification. Thus, a laser output used for the dicing lines 62 is made equal to or lower than the output used for the dicing lines 60. Also, in a comparison between the dicing lines 62 and the dicing lines 63 to be formed after the dicing lines 62, application is performed a fewer number of times for the dicing lines 62 than for the dicing lines 63, although the laser beam application depth to the hollow portion 22 is the same. The reason for this is because due to concentration of stress at the dicing lines 62 in the processing performed by application of the laser 40 along the dicing lines 62, strain concentrates at the dicing lines 62.

Meanwhile, stress is less likely to concentrate at the dicing lines 63 for which application is performed after the dicing lines 62, which makes it less likely for dicing to occur even in a case where modified regions similar to those at the dicing lines 62 are formed. Thus, compared to the dicing lines 62, the output of the laser 40 is increased to decrease the crystal strength of the modified regions, or the number of times of laser application and scanning is increased to form more modified regions in the depth direction of the first substrate 20. Then, dicing performance comparable to that on the dicing lines 62 can be achieved on the dicing lines 63.

Although the laser 40 is applied in the order of the dicing lines 62 and the dicing lines 63 in the embodiment described above, it is to be noted that the order of application in S65 can be changed. However, it is necessary that the laser output used for the dicing lines formed by application performed first be equal to or lower than the laser output used for the dicing lines 60 in the previous step. Also, in the formation of modified regions along the dicing lines formed by application performed later, the number of times of scanning is increased or the output of the laser 40 is increased compared to the formation of modified regions along the dicing lines formed by the application performed first, so as to decrease the crystal strength of the modified regions. This enables modified regions to be formed in no particular order.

In S66, the wafer 10 is rotated 90° about the Z-axis.

In S67, laser application and scanning is performed on the first substrate 20 along dicing lines 64. Specifically, as shown in FIG. 7E, using a stealth dicing approach, the depth of laser beam application of the laser 40 is adjusted, and laser scanning is performed at the laser beam application depth thus adjusted. As a result, a plurality of modified regions 42 are formed along each predetermined dicing line 64 (specifically in the Y-direction (see, e.g., FIG. 4)) at positions different from one another in the Z-direction. In this event, the modified regions 42 are formed from the ones at positions farther away from (i.e., deeper relative to) the outer surface (the interface) from which the laser is applied. Note that in the present embodiment, as shown in FIG. 7E, the laser 40 is applied from the first substrate 20 side by using a stealth dicing approach.

In S68, the wafer 10 is diced by execution of expansion processing. Expanding the dicing tape with a predetermined force generates cracks originating from the modified regions, and the cracks thus generated extend completely through the entire region of the wafer in the thickness direction, dicing the wafer and singulating chips. Note that, as described earlier, the Y-direction position of the modified regions formed using the dicing line 60 and the Y-direction position of the modified regions formed using the dicing line 63 are substantially the same, and in this step, these substantially same positions become a dicing surface through which the first substrate and the second substrate communicate with each other. Note that the expansion method is not limited to a particular one. For example, an expander may be used to expand the dicing tape and thereby dice the wafer.

Figure 9:
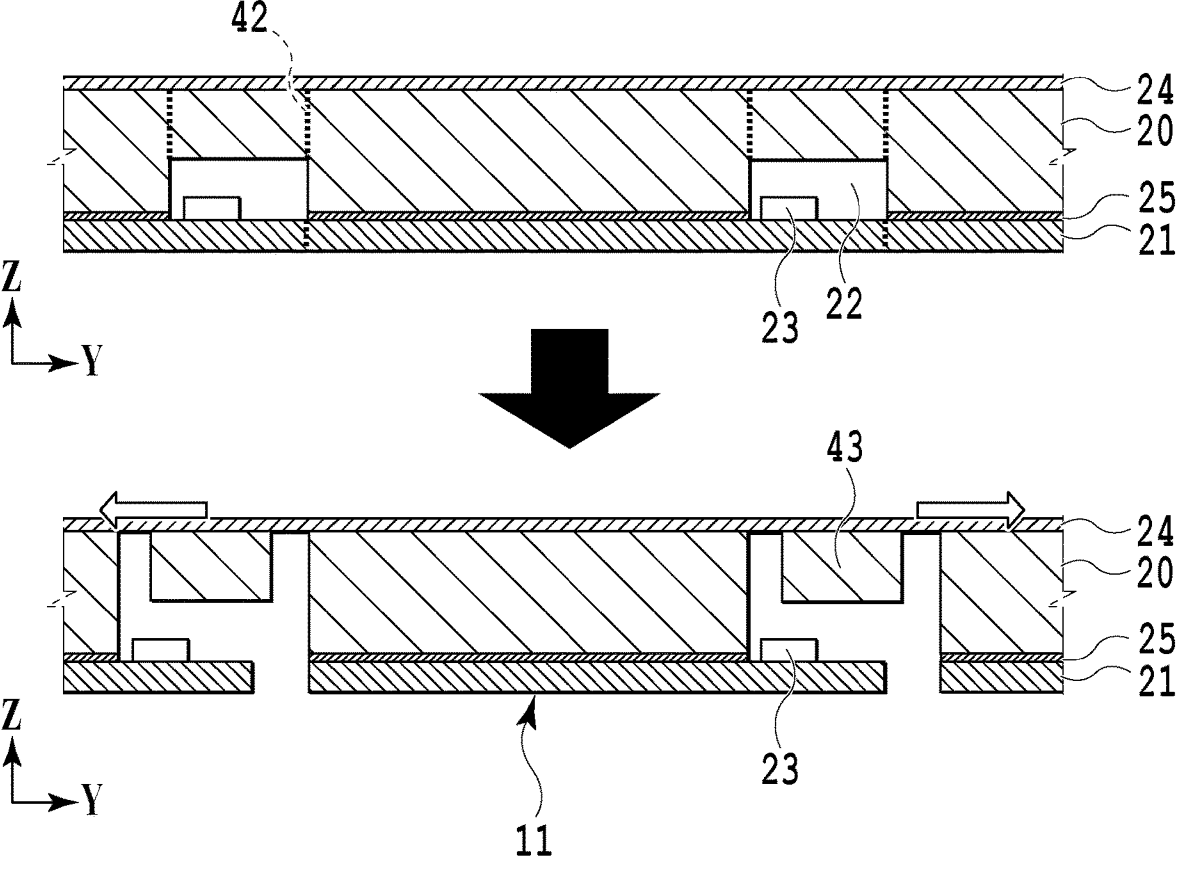
FIG. 9 is a schematic diagram showing an expansion process in the first embodiment.

FIG. 9 is a schematic diagram showing an expansion process in the present embodiment. As shown in FIG. 9, expanding the dicing tape 24 with a predetermined force divides the wafer 10 and singulates chips therefrom, the division originating from the modified regions 42. At the same time as the singulation, the terminals 23 disposed at the second substrate 21 are exposed. Because of this exposure, regions of the first substrate 20 that are in between the lines of the plurality of modified regions 42 formed using the laser 40 become unneeded wastes 43. The wastes 43 are held onto the dicing tape 24 and do not fall. Thus, the chips 11 can be singulated by exposure of the first substrate 20 and the terminals 23 with less contamination and damage on the first substrate 20 and the terminals 23.

In a case where, e.g., the wafer is a stack of three or more layers, it is desirable that the depths of laser borders in scanning of the laser 40 from above and below be determined appropriately considering the influence of laser attenuation. Also, changing the dicing positions at the second substrate relative to the hollow portions makes it possible for chips to be singulated as L-shaped chips 12 with terminals at one side as shown in FIG. 5A or as inverted-T-shaped chips 13 with terminals at both sides as shown in FIG. 5B. Also, the present disclosure can be applied not only to the mode shown above, but also to other shapes, including one where hollow portions are exposed. Note that the chip 12 with terminals at one side and the chip 13 with terminals at both sides are used as a component for a liquid ejection head in a printer such as an inkjet printing apparatus.

Note that in the present embodiment, the first substrate 20 is an ink flow channel substrate where ink flow channels are formed, and the second substrate 21 is a composite substrate having an energy generating element substrate including energy generating elements for ejecting ink from ejection ports and an ejection port substrate where the ink ejection ports are formed. Also, each of the first substrate 20 and the second substrate 21 includes a wafer material made of silicon crystals. However, substrates to which the present disclosure can be applied are not limited to these substrates.

Advantageous Effects Offered by the Present Embodiment

As thus described, in the present embodiment, the second substrate 21 is processed along the dicing lines 60 by a first laser. Then, the first substrate 20 is processed along the dicing lines 62 by a second laser, and the first substrate 20 is processed along the dicing lines 63 by a third laser. In these processes, modified regions are formed so that the Y-direction position of the modified regions formed in the second substrate 21 by the application of the first laser may be substantially the same as the Y-direction position of the modified regions formed in the first substrate 20 by the application of the third laser.

In stealth dicing of a bonded wafer formed of a plurality of layers and having hollow portions, the present embodiment can increase the dimensional accuracy of the chips by preventing the strength on the dicing lines from drastically decreasing before expansion and controlling stress concentration due to an increase in modified regions. Thus, dicing failures, such as dicing the wafer unexpectedly or failing to dice the wafer, can be prevented.

Second Embodiment

Figure 10:
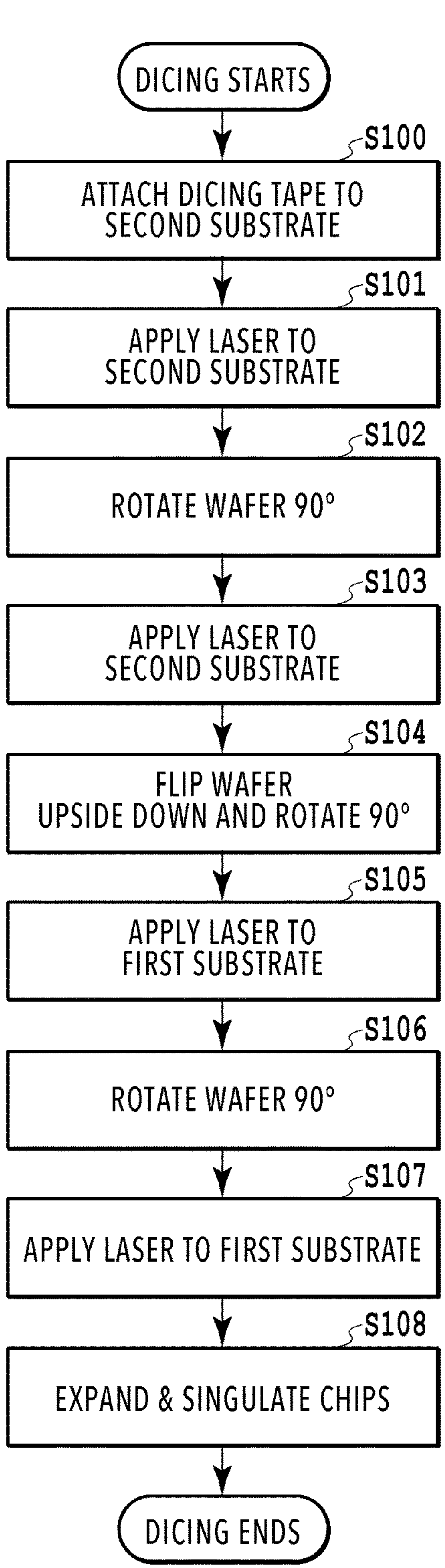
FIG. 10 is a flowchart of a dicing method of a second embodiment.

A second embodiment according to the present disclosure is described below using FIGS. 10 to 13. FIG. 10 is a flowchart of a dicing method of the present embodiment, and the dicing method has Steps S100 to S108. FIGS. 11A to 11E are schematic diagrams showing a process of stealth dicing of the wafer 10 of the present embodiment.

Figures 11A, 11B, 11C, 11D, 11E:
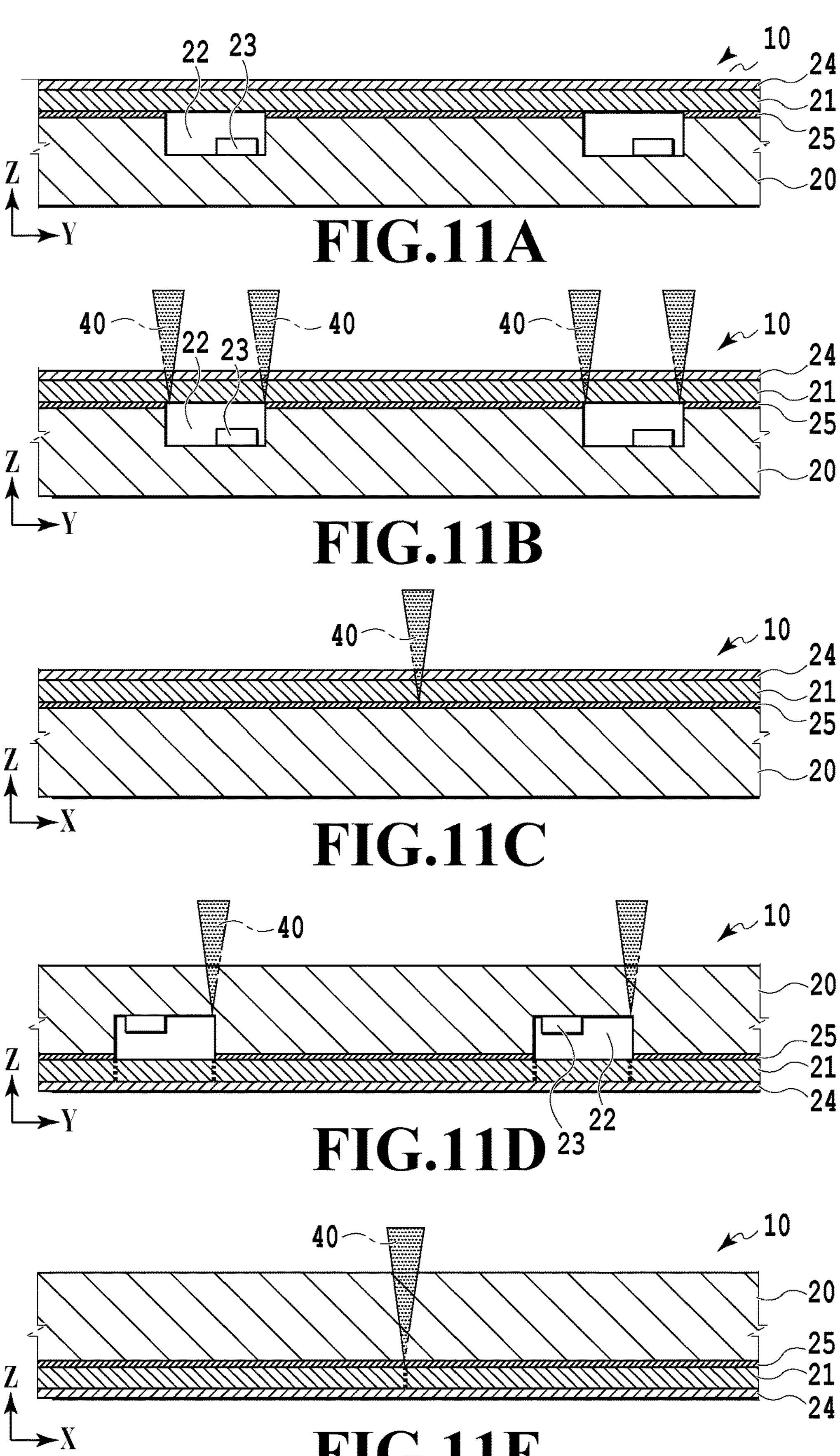
FIGS. 11A to 11E are schematic diagrams showing a process of stealth dicing of the second embodiment.

FIG. 11A is a sectional view of the wafer 10 of the present embodiment and shows a state immediately after S100 to be described later. As shown in FIG. 11A, the wafer 10 is formed of the first substrate 20 and the second substrate 21 bonded to each other with the hollow portions 22 formed by the concave portions of the first substrate 20 and the flat surface of the second substrate 21, and the terminals 23 for electric connection are provided at the bottom surfaces of the concave portions of the first substrate 20. The thickness (the Z-direction length) of the first substrate 20 is such that the thickness of regions provided with the concave portions for the hollow portions 22 is equal to or larger than the thickness of the second substrate 21.

To expose the terminals 23, a plurality of modified regions 42 need to be formed in each substrate by application of two lasers 40 to the second substrate 21 and one laser 40 to the first substrate 20. In this process, part of the second substrate 21 becomes wastes, and for this reason, the dicing tape 24 for waste collection is attached to the surface of the second substrate 21 from which the wastes are going to be produced.

S100 in FIG. 10 is a step for attaching the dicing tape 24 to the second substrate 21 of the wafer 10. The dicing tape 24 is first attached and secured to a typical dicing frame (not shown) larger than the outer circumference of the wafer 10, and the dicing tape 24 thus secured is attached to the wafer 10.

In S101, laser application and scanning is performed on the second substrate 21 above the hollow portions 22 along dicing lines 72 and dicing lines 73. In this step, as shown in FIG. 11B, the laser 40 enters through the surface to which the dicing tape 24 is attached. Note that unlike the first embodiment (the dicing lines 62 and the dicing lines 63 in FIG. 4), in the present embodiment, two sets of dicing lines (the dicing lines 72 and the dicing lines 73) are set for the second substrate 21.

In S101, first, modified regions are formed along the dicing lines 73. Specifically, the depth of laser beam application of the laser 40 is adjusted between the lower surface of the second substrate 21 defining the hollow portions 22 and the upper surface of the second substrate 21 where the dicing tape 24 is attached. Then, laser scanning is performed along each dicing line 73 at the adjusted laser beam application depth. Such laser scanning is performed a plurality of times at different laser beam application depths from the deeper positions. As a result, a plurality of modified regions 42 are formed along each predetermined dicing line 73 (in the X-direction) at positions different from one another in the Z-direction.

After that, modified regions are formed along the dicing lines 72. Specifically, the depth of laser beam application of the laser 40 is adjusted between the lower surface of the second substrate 21 defining the hollow portions 22 and the upper surface of the second substrate 21 where the dicing tape 24 is attached. Then, laser scanning is performed along each dicing line 72 at the adjusted laser beam application depth. Such laser scanning is performed a plurality of times at different laser beam application depths from the deeper positions. As a result, a plurality of modified regions 42 are formed along each predetermined dicing line 72 (in the X-direction) at positions different from one another in the Z-direction.

Figure 12A:
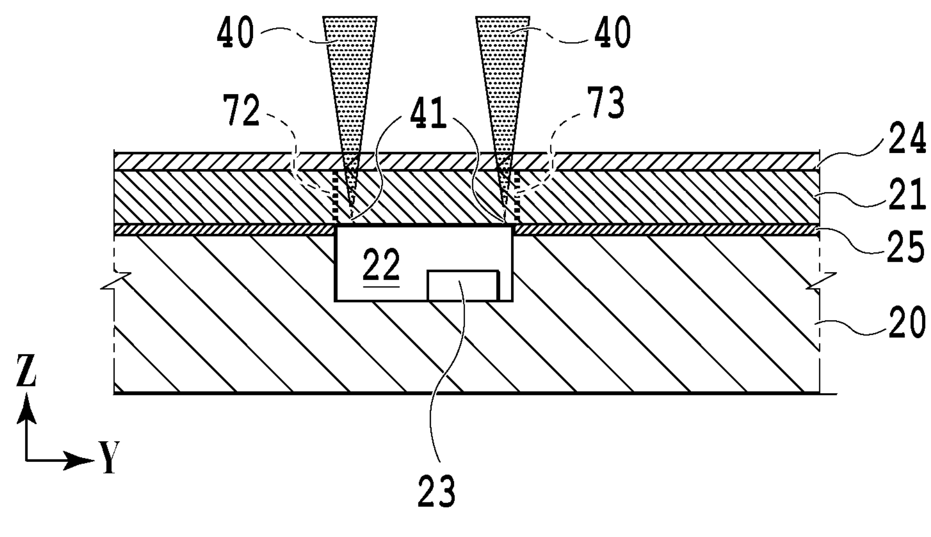
FIGS. 12A and 12B are schematic diagrams showing the dicing method of the second embodiment.
Figure 12B:
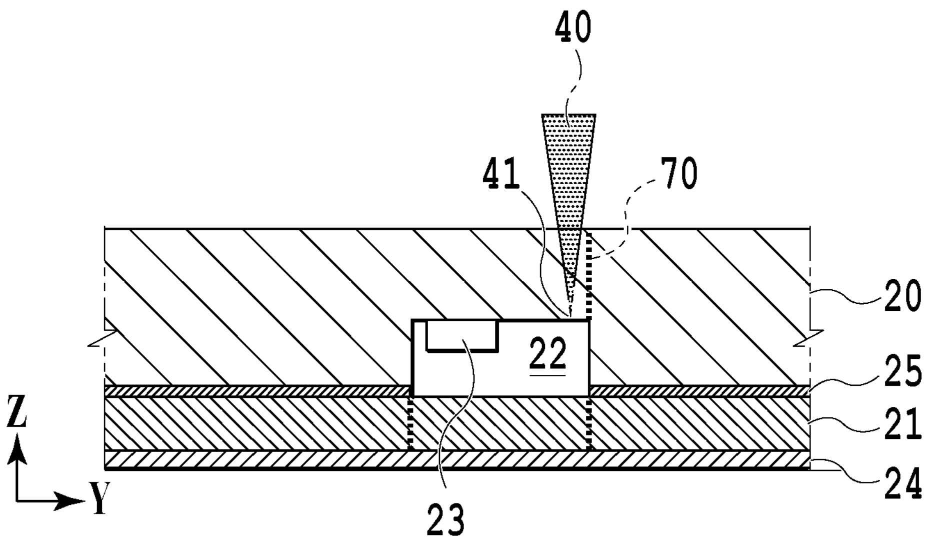

FIGS. 12A and 12B are schematic diagrams showing a hollow-portion dicing method of the present embodiment. More specifically, FIG. 12A shows the relation between the positions of dicing lines at a surface on the second substrate 21 side and the positions of laser application, and FIG. 12B shows the relation between the position of a dicing line at a surface on the first substrate 20 side and the position of laser application.

In FIG. 12A, each of the two lasers 40 enters through the surface of the dicing tape 24 attached to the second substrate 21. The Y-direction position of incidence of the laser 40 is such that the laser is applied from a location slightly offset from the dicing line 72 or the dicing line 73 toward the center of the hollow portion 22 so as to reach the inside of a border plane defining the hollow portion 22, which is on the XY-plane. In this event, the radiation position is adjusted so as to be within the allowable tolerance of the chip and the apparatus.

To perform scanning and application along the dicing lines 72, the depth of laser beam application is adjusted between the lower surface of the second substrate 21 defining the hollow portions 22 and the upper surface of the second substrate 21, and scanning is performed along the dicing lines 72 from the ones at positions farther away from (i.e., deeper relative to) the upper surface of the second substrate 21. A plurality of modified regions 42 are thus formed along each dicing line 72. Scanning and application along the dicing lines 73 is performed in a manner similar to scanning and application along the dicing lines 72.

Control of the two lasers 40 described above is performed such that an output of the laser used for modified regions along the dicing lines 73, which is formed by application performed first, is made smaller than the output of the laser used for the dicing lines 72. Also, to have a fewer number of layers of modified regions, a fewer number of scanning and application is performed for the formation of modified regions along the dicing lines 73 than for those along the dicing lines 72. Although the lasers 40 are applied in the order of the dicing lines 73 and the dicing lines 72 in the embodiment described above, it is to be noted that the order of application can be changed (however, conditions for the application need to be changed as needed).

Back to the description with FIG. 10, in S102, the wafer 10 is rotated 90° about the Z-axis.

In S103, laser application and scanning is performed on the second substrate 21 along the dicing lines on the second substrate 21. Specifically, as shown in FIG. 11C, using a stealth dicing approach, the depth of laser beam application of the laser 40 is adjusted between the upper surface and the lower surface of the second substrate 21, and laser scanning is performed at the laser beam application depth thus adjusted. As a result, a plurality of modified regions 42 are formed along each predetermined dicing line at positions different from one another in the Z-direction. In this event, modified regions are formed from the ones at deeper positions.

In S104, the wafer 10 is flipped upside down and rotated 90°. As a result of this step, the interface (the outer surface) on the first substrate 20 side is now the surface on which laser application can be performed (see FIG. 11D).

In S105, laser application and scanning is performed on the first substrate 20, which is thicker than the second substrate 21, along dicing lines 70 (see FIG. 12B). In this step, in order for the wafer to be diced after stealth dicing, modified regions are formed in the first substrate 20. The output of the laser 40 used for the dicing lines 70 in the processing in this step is equal to or higher than the output used for the dicing lines 73.

In S106, the wafer 10 is rotated 90° about the Z-axis.

In S107, laser application onto the first substrate 20 and laser scanning along dicing lines on the first substrate 20 are performed. Specifically, as shown in FIG. 11E, using a stealth dicing approach, the depth of laser beam application of the laser 40 is adjusted, and laser scanning is performed at the laser beam application depth thus adjusted. As a result, a plurality of modified regions 42 are formed along each predetermined dicing line (in the Y-direction) at positions different from one another in the Z-direction. In this event, the modified regions are formed from the ones at deeper positions. Note that in the present embodiment, as shown in FIG. 11E, using a stealth dicing approach, the laser 40 is applied to the interface (the outer surface) on the first substrate 20 side.

In S108, the wafer 10 is diced by execution of expansion processing. Expanding the dicing tape with a predetermined force generates cracks originating from the modified regions, and the cracks thus generated extend completely through the entire region of the wafer in the thickness direction, dicing the wafer and singulating chips. Note that the expansion method is not limited to a particular one. For example, an expander may be used to expand the dicing tape and thereby dice the wafer.

Figure 13:
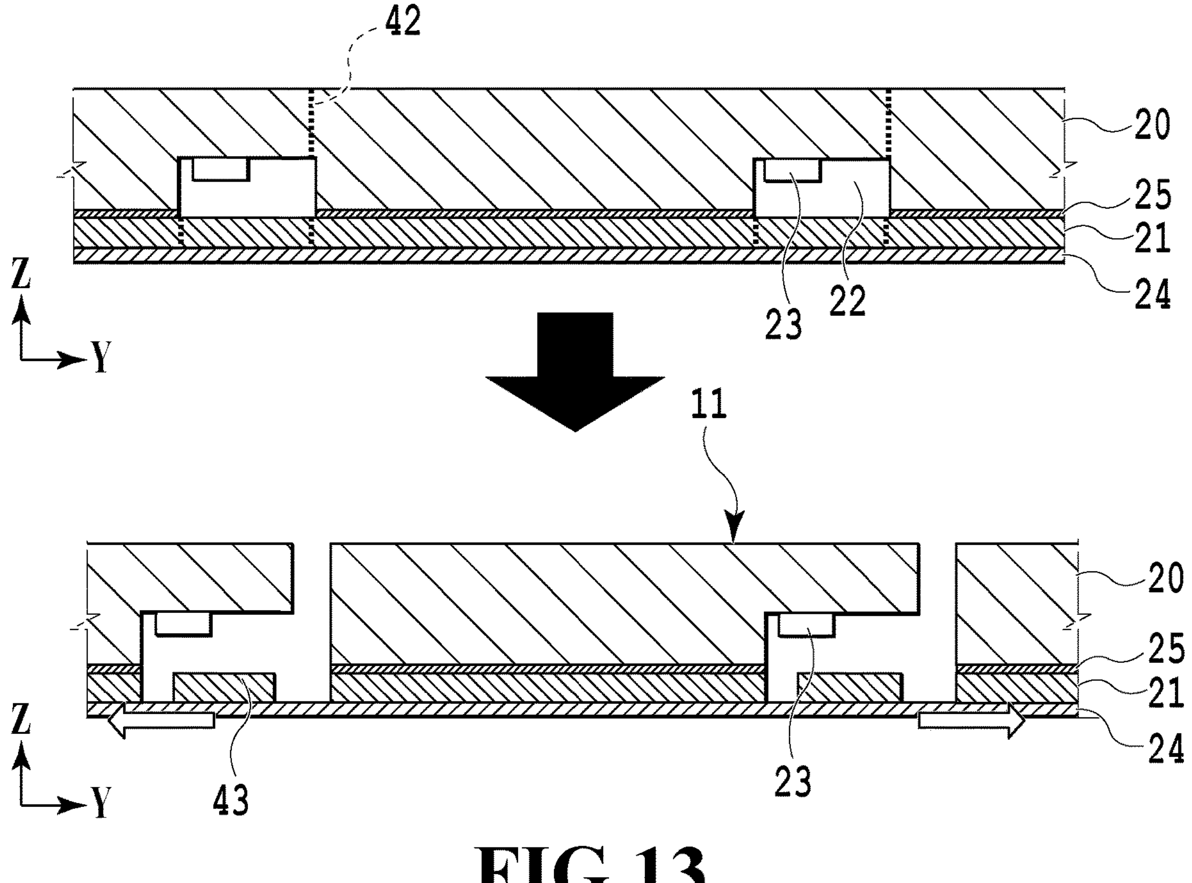
FIG. 13 is a schematic diagram showing an expansion process in the second embodiment.

FIG. 13 is a schematic diagram showing an expansion process in the present embodiment. As shown in FIG. 13, expanding the dicing tape 24 with a predetermined force divides the wafer 10 and singulates chips, the division originating from the modified regions 42. At the same time as the singulation, the terminals 23 disposed at the first substrate 20 are exposed. Because of this exposure, regions of the second substrate 21 that are in between the lines of the plurality of modified regions 42 formed using the laser 40 become unneeded wastes 43. The wastes 43 are held onto the dicing tape 24 and do not fall. Thus, the chips 11 can be singulated by exposure of the second substrate 21 and the terminals 23 with less contamination and damage on the second substrate 21 and the terminals 23.

Advantageous Effects Offered by the Present Embodiment

In stealth dicing of a bonded wafer formed of a plurality of layers and having hollow portions, the present embodiment can increase the dimensional accuracy of the chips by preventing the strength on the dicing lines from drastically decreasing before expansion and controlling stress concentration due to an increase in modified regions. Thus, dicing failures, such as dicing the wafer unexpectedly or failing to dice the wafer, can be prevented.

Because the present disclosure can improve the dimensional accuracy of chips singulated in stealth dicing of a wafer having hollow portions and thus can reduce the possibility of processing failures occurring.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japanese Patent Application No. 2022-174572, filed Oct. 31, 2022, which are hereby incorporated by reference wherein in its entirety.

What is claimed is:

1. A stealth dicing method performed on a wafer having a first substrate, a second substrate bonded to the first substrate, and a hollow portion defined by a concave portion at least partially disposed adjacent to an interface of the first substrate and the second substrate, the second substrate being thinner than the first substrate in a region including the hollow portion, with an X-direction being a direction in which the hollow portion extends, a Z-direction being a direction of a thickness of the wafer, and a Y-direction being a direction orthogonal to the X-direction and the Z-direction, the stealth dicing method comprising:

a first step of performing laser application on the second substrate to form a modified region in the second substrate, the modified region being a region for dicing and having low crystal strength; and a second step of performing laser application on the first substrate to form a modified region in the first substrate, wherein in one of the first step and the second step, a plurality of the modified regions are formed, arranged in the Z-direction at positions corresponding to both sides of the hollow portion in the Y-direction, and in another one of the first step and the second step, a plurality of the modified regions are formed, arranged in the Z-direction at a position corresponding to one side of the hollow portion in the Y-direction.

2. The stealth dicing method according to claim 1, wherein in the first step, a first laser application is applied to positions at the second substrate corresponding to a first side of the hollow portion in the Y-direction to form the plurality of modified regions arranged in the Z-direction, and in the second step, a second laser application is applied to positions at the first substrate corresponding to the first side of the hollow portion in the Y-direction to form the plurality of modified regions arranged in the Z-direction, and further, a third laser application is applied to positions at the first substrate corresponding to a second side of the hollow portion in the Y-direction to form the plurality of modified regions arranged in the Z-direction.

3. The stealth dicing method according to claim 2, wherein an output of the second laser application is equal to or lower than an output of the first laser application.

4. The stealth dicing method according to claim 3, wherein in the second step, an output of the laser in the third laser application is higher than an output of the laser in the second laser application, and in the second step, the third laser application and scanning of the laser is performed more times than in the second laser application.

5. The stealth dicing method according to claim 4, wherein a Y-direction position of the modified regions formed in the second substrate by the first laser application and a Y-direction position of the modified regions formed in the first substrate by the third laser application are a substantially same position.

6. The stealth dicing method according to claim 5, further comprising executing expansion processing, wherein the substantially same position is where a dicing surface through which the first substrate and the second substrate communicate with each other is formed in the execution of the expansion processing.

7. The stealth dicing method according to claim 6, wherein the first substrate has the concave portion at a surface joined to a flat surface of the second substrate, and the hollow portion is created by the concave portion of the first substrate and the flat surface of the second substrate.

8. The stealth dicing method according to claim 7, wherein in the hollow portion, a plurality of terminals are disposed at the second substrate, arranged in the X-direction.

9. The stealth dicing method according to claim 8, further comprising attaching a dicing tape to the first substrate, wherein as a result of the expansion processing, part of the first substrate is held onto the dicing tape as a waste.

10. The stealth dicing method according to claim 9, wherein the first substrate and the second substrate each includes a wafer material made of silicon crystal.

11. The stealth dicing method according to claim 4, wherein a Y-direction position of the modified regions formed in the second substrate by the first laser application and a Y-direction position of the modified regions formed in the first substrate by the second laser application are a substantially same position.

12. The stealth dicing method according to claim 1, wherein in the first step, a first laser application is applied to positions at the second substrate corresponding to a first side of the hollow portion in the Y-direction to form the plurality of modified regions arranged in the Z-direction, and further, a second laser application is applied to positions at the second substrate corresponding to a second side of the hollow portion in the Y-direction to form the plurality of modified regions arranged in the Z-direction, and in the second step, a third laser application is applied to positions at the first substrate corresponding to the first side of the hollow portion in the Y-direction to form the plurality of modified regions arranged in the Z-direction.

13. The stealth dicing method according to claim 12, wherein in the hollow portion, a plurality of terminals are disposed at the first substrate, arranged in the X-direction.

* * * * *